United States Patent [19]

Neyroud et al.

[11] Patent Number: 4,648,008
[45] Date of Patent: Mar. 3, 1987

[54] MOUNTING DEVICE FOR A THICK LAYER ELECTRONIC MODULE

[75] Inventors: Jean Neyroud, Domene; Alain Guillier, Meylan; Abdelkader Mahi, Grenoble, all of France

[73] Assignee: La Telemecanique Electrique, France

[21] Appl. No.: 751,641

[22] Filed: Jul. 3, 1985

[30] Foreign Application Priority Data

Jul. 6, 1984 [FR] France .................... 84 10772

[51] Int. Cl.⁴ .................... H01L 23/32; H01L 23/40
[52] U.S. Cl. .................... 361/387; 357/80; 357/81; 361/388
[58] Field of Search .................... 361/386, 387, 388; 357/80, 81

[56] References Cited

U.S. PATENT DOCUMENTS

| 4,069,497 | 1/1978 | Steidlitz | 361/386 X |
| 4,537,246 | 8/1985 | Lloyd | 357/81 X |
| 4,544,942 | 10/1985 | McCarthy | 357/81 |
| 4,563,725 | 1/1986 | Kirby | 361/386 X |

Primary Examiner—Louis K. Rimrodt
Attorney, Agent, or Firm—William A. Drucker

[57] ABSTRACT

A device is provided for mounting a thick layer component, more especially for an electronic module. Said component comprises a thick layer deposited on a face of an electrically insulating support. This face is, in the mounted position, on the same side as a heat sink, whereas the thick layer is separated from the heat sink by an electrically insulating and heat conducting device of a given flexibility which accommodates the imperfections of the thick layer.

15 Claims, 4 Drawing Figures

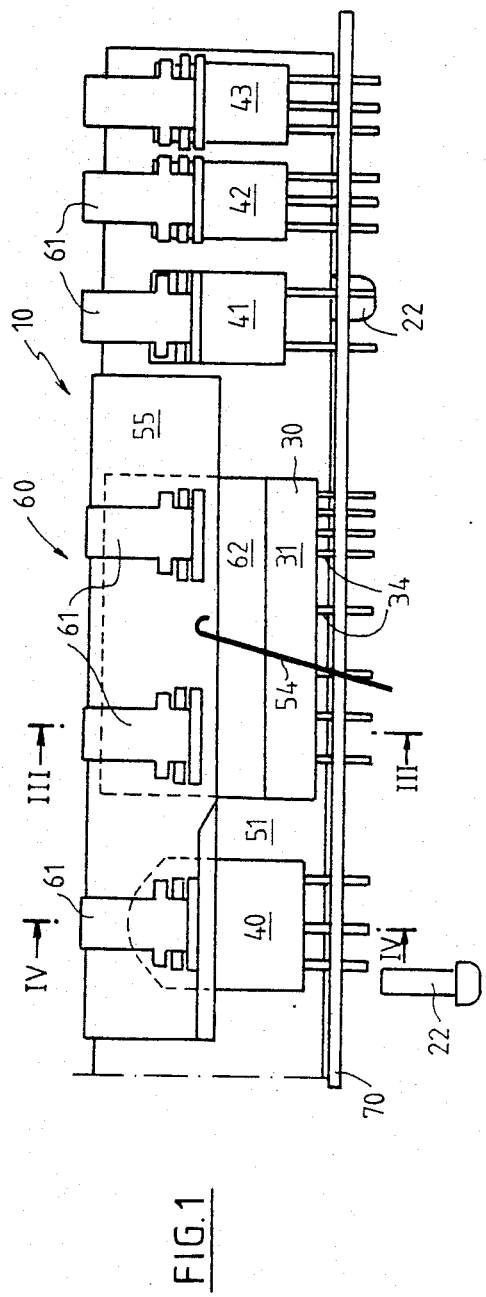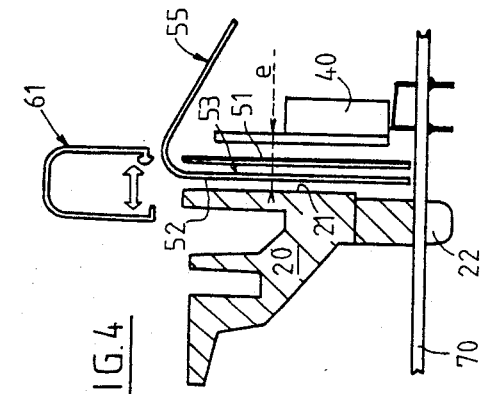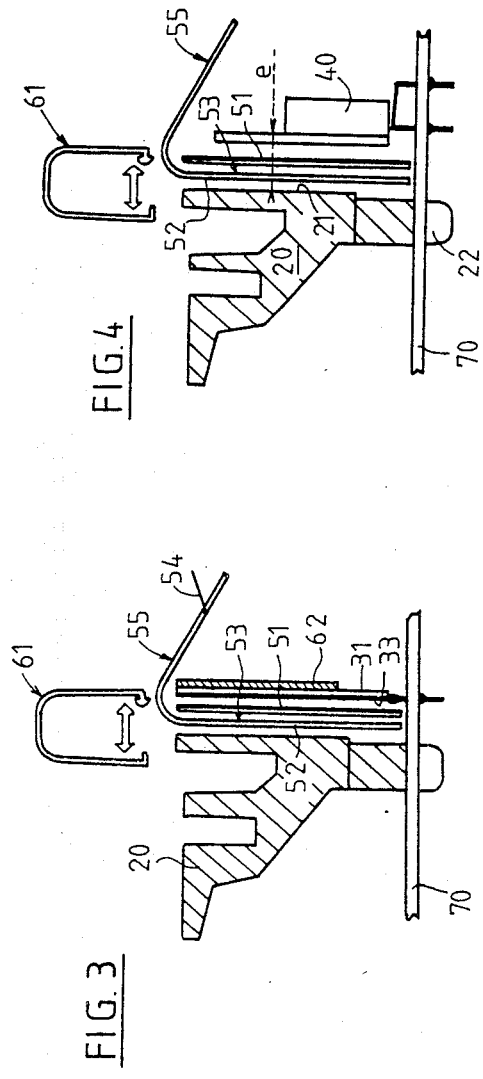

4,648,008

MOUNTING DEVICE FOR A THICK LAYER ELECTRONIC MODULE

BACKGROUND OF THE INVENTION

1. Field of the Invention

The present invention relates to a device for mounting at least one heat generating component on a heat sink, comprising an electrically insulating support, the heat generating component being disposed on a first face of the support and means for clamping the insulating support against a bearing face of the heat sink.

2. Description of the Prior Art

Such devices are known in particular from the U.S. Pat. No. 4,069,497 and they have a satisfactory thermal behavior while allowing the component to be removed when it is defective. However, these devices are not suitable for mounting thick layer components, particularly those having a thick resistive layer capable of dissipating a power of the order of a few tens of watts. In addition, they do not lend themselves readily to mounting a thick layer circuit and diode or transistor chips on the same heat sink.

SUMMARY OF THE INVENTION

The aim of the invention is more particularly to overcome the disadvantages of known devices for mounting heat generating components of a heat sink by providing a mounting device for a thick layer component in which the component is removably applied on its thick layer side against the heat sink.

It also aims at avoiding damage to the thick layer of a component, not only during handling but also during use of the mounting device.

Finally, it aims at simplifying, more especially on an electric module printed circuit card, the assembly of thick layer components and semi conductor chips on the same heat sink.

According to the invention, in a mounting device of the type mentioned in the preamble, the heat generating component is a thick layer component deposited on the first face of the support, said first face being situated in the mounted position on the heat sink side, whereas the thick layer of the component is separated from the heat sink by a heat conducting insulating device of predetermined flexibility for accomodating the imperfections of the thick layer.

The result is that the thick layer, which may comprise one or more power resistors, is protected because it is situated on the heat sink side, whereas heat removal is readily provided through the thick layer towards the heat sink via the heat conducting insulating device; the flexibility of the insulating device, formed for example by a coating or a foil of flexible material such as a thermosilicon, allows the device to accomodate the roughnesses or variations of thickness of the thick layer.

When at least one thick layer component and semiconductor chips such as chips TO 220 are mounted on the same heat sink, it is advantageous to provide a biasable screen inserted between the thick resistive layer and the heat sink for reducing the coupling capacity between the resistors of the thick layer and the heat sink, the screen being connected to an appropriate potential for this purpose. This screen is formed preferably from a second insulating foil having, on the first insulating foil side, an electrically conducting coating.

Preferably, a stiffening wafer is associated with the component, this stiffening wafer being fixed to a second face of the support, opposite the first face of said support, by bonding for example. The stiffening wafer at the same time avoids hot spots on the component and serves as a shim.

The invention also relates to the electronic modules housing a card comprising the above mounting device.

BRIEF DESCRIPTION OF THE DRAWINGS

One embodiment of the invention will be described hereafter by way of non limitative example, with reference to the accompanying drawings in which:

FIG. 1 shows in elevation a mounting device of the invention combined with a printed card;

FIGS. 3 and 4 show exploded schematical views in section, also on an enlarged scale, through planes III—III and IV—IV of the device of FIG. 1.

DESCRIPTION OF THE PREFERRED EMBODIMENTS

Figure 2:
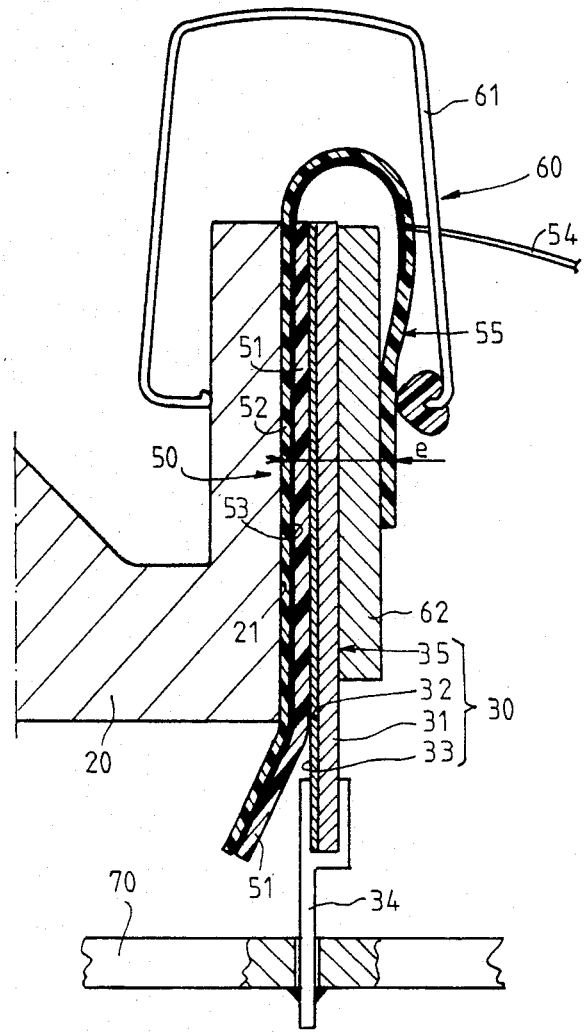
FIG. 2 shows an enlarged view in section through the plane II—II of the mounting device of FIG. 1.

The mounting device 10 illustrated in FIG. 1 is intended for associating with the same heat sink, 20, a thick layer hybrid technology component 30 and several semiconductor component chips 40, 41, 42 and 43, TOP3, TO 220 associated with the same electronic card. The dimensions of some of the elements of the device are exaggerated for facilitating understanding.

The heat sink 20 and components 40, 43 are assembled together, after interpositioning of an insulating device 50, with clamping means 60; components 40–43 are then soldered to a printed circuit card 70 carrying other components not shown; card 70 is housed for example in an electronic module belonging to an automatic device control system.

The heat sink 20 is a finned aluminium-shaped piece having a flat bearing face 21 on the component side; the heat sink is held on card 70 by securing means 22. When the card 70 is housed in an electronic module with metal casing, the heat sink 20 may be fixed directly to this casing.

The thick layer component 30 comprises an insulating support 31 formed from an alumina wafer; this support may of course be made from another ceramic material, or from anodized aluminium or from enamelled metal sheet.

On one face 32 of the insulating support 31 is deposited a thick layer 33 of resistive paste; several layers of resistive paste may also be deposited on face 32. The thick layer 33 may comprise a single power resistor or be adapted for defining several power resistors requiring heat dissipation of the order of a few tens of watts. The thick layer 33 is connected to the printed circuit of card 70 by connecting barbs 34 or else by means of a cable harness allowing slight misalignment or movement of the heat sink with respect to card 70. Fixed to face 35 of the ceramic support opposite face 32, a metal wafer 62 provides mechanical stiffening for the insulating support 31. Wafer 62 also provides heat diffusion which contributes to avoiding hot spots on the component.

The insulating device 50 comprises an insulating foil 51 disposed on the resistive layer 33 so as to allow easy removal of the component. The insulating foil 51 is made from thermosilicon or another heat conducting material having a flexibility allowing the unevennesses or variations of thickness of the resistive layer of the circuit to be absorbed.

Foil 51 is a strip which substantially covers the whole of face 21 of the heat sink so as to electrically isolate the circuit and the different chip carriers 40–43 with respect to the heat sink and it is capable of providing insulation at a voltage of several KV.

Device 50 further comprises a foil 52 made from an insulating material such as a polyamide bonded to foil 51 and having facing this latter a conducting layer 53, for example a copper coated face, connected to an appropriate potential point of card 70 by means of a conductor 54 so as to form a biased screen which reduces the coupling capacity between the resistances of the thick layer 33 and heat sink 20. Such an arrangement has a particular advantage when the resistances of the thick layer have variable currents flowing therethrough, particularly in the case where they form part of a chopped power supply.

The screen foil 52 is common to the component and to the chip carriers 40, (of type TOP 3) which require capacitive decoupling and high insulation. The copper coated area 53 is preferably defined approximately by the surfaces of the component and of chip carrier 40 so as to limit the leak currents.

The insulating foil 51 has, facing the screen foil 52 an adhesive face which allows an insulating subassembly to be formed by adhesion of foil 52 against foil 51, this sub-assembly being more flexible on the thick layer side than on the heat sink side.

Foil 51 is slightly longer than foil 52 and thus allows ready fixing of the sub-assembly to the face 21 of the heat sink by means of the adhesive face of foil 51.

The screen foil 52 has a bent back zone 55 shown in FIGS. 1 and 2 (bent back position) and in FIGS. 3 and 4 (during bending back); this bent back zone covers a part of face 35 of the component opposite face 32, as well as a part of chip carrier 40 (TOP3) and it increases the leak line distances between the thick layer 33 on the one hand, clips 61 and the heat sink 20 on the other.

The clamping means 60 comprise resilient clips 61 for clipping the chip carriers and the component against the heat sink; one clip is provided per chip carrier for example of the TOP3 or TO 220 type and one or more clips for the component. It will be noted that clips 61 are identical for chip carriers 40–43 and for the component. The wafer 62 fixed, for example bonded, to face 35 of the ceramic support receives, directly or via area 55 of the screen, the pinching force of clips 61, and in addition it forms a shim defining, in line with the clamping zone of the insulating device 50-30-wafer 62 assembly, a thickness "e" substantially equal to that of the adjacent insulating device 50- chip carrier 40 assemblies in line with their own clamping zone.

The heat sink 20 may be possibly connected mechanically or fixed to a main heat sink which forms part of the mechanical structure of the casing of an electronic module receiving card 70, the cooling fins of the heat sink being situated in the operating position in a vertical plane so as to provide maximum heat dissipation.

It goes without saying that modifications may be made to the embodiment described without departing from the scope and spirit of the invention. In particular, support 31 of the thick layer component may comprise on face 35 other passive or semiconductor components, wafer 62 being suitably adapted for this purpose. The means for connecting the thick layer 33 of component 30 to card 70 may be formed by cable harnesses so as to allow misalignment or movement of heat sink 20 with respect to the card.

What is claimed is:

1. A device for mounting at least one heat generating component on a heat sink, said device comprising an electrically insulating support having a first face on which is disposed the heat generating component and means for clamping the insulating support against a bearing face of the heat sink, wherein said heat generating component consists in a thick layer component deposited on the first face of said support, and said first face is situated in the mounted position on the heat sink side, whereas the thick layer of said component is separated from the heat sink by a heat conducting electrially insulating device having a predetermined flexibility for accomodting the imperfections of said thick layer.

2. The mounting device as claimed in claim 1, wherein said electrically insulating device comprises an electric insulating foil made from a flexible material such as a thermosilicon, disposed directly on said thick layer.

3. The mounting device as claimed in claim 1, wherein a biasable screen is inserted between said thick layer and the heat sink for reducing the coupling capacity between the thick layer and the heat sink, said screen being connected to an appropriate potential for this purpose.

4. The mounting device as claimed in claim 3, wherein the biasable screen is formed by a second thin electrically insulating foil inserted between the first insulating foil and said heat sink, said second foil being provided on the first foil side with an electrically conducting coating connected to the appropriate potential.

5. The mounting device as claimed in claim 3, wherein said biasable screen is fixed to said first insulating foil by means of an adhesive so as to form an insulating sub-assembly more flexible on the thick layer side than on the heat sink side.

6. The mounting device as claimed in claim 1, wherein a stiffening wafer is associated with the component, said stiffening wafer being fixed to a second face of the support opposite the first face of said support.

7. The mounting device as claimed in claim 6, wherein said stiffening wafer forms a heat diffusion means contributing to avoiding hot spots on the component.

8. The mounting device as claimed in claim 6, wherein said component and said semiconductor component chip carriers are removably fixed to the heat sink by means of identical resilient clips, said stiffening wafer forming a shim for adapting the thickness "e" of the clamping zone of the component to the thickness of the clamping zone of the chip carriers.

9. The mounting device as claimed in claim 8, wherein said biasable screen has a zone bent back against the stiffening wafer associated with the component and aganst the semi conductor component chip carriers requiring high insulation with respect to the heat sink and to the clips.

10. The mounting device as claimed in claim 1, wherein semiconductor component chip carriers are mounted on the same heat sink.

11. The mounting device as claimed in claim 10, wherein the area of the electrically conducting coating of the biasable screen corresponds substantially to that of the components and of the semiconductor component chip carriers to be decoupled capacitively.

12. The mounting device as claimed in claim 1, wherein said thick layer component has one or more resistors, said means for clamping the component on the heat sink being formed by one or more clamping clips.

13. The mounting device as claimed in claim 1, wherein the thick layer of the component is connected to a card by means of a cable harness.

14. In an electronic module comprising a printed circuit card, at least one thick layer component implanted on the card perpendicularly thereto, a heat sink and a device for mounting the component on the heat sink before soldering of the component to the card, said mounting device comprising an electrically insulating support having a first face on which is disposed the thick layer component and means for clamping the insulating support against a bearing face of the heat sink, wherein said first face is situated in the mounted position on the heat sink side, whereas the thick layer of said component is separated from the heat sink by a heat conducting electrically insulating device having a predetermined flexibility for accomodating the imperfections of said thick layer.

15. The electronic module as claimed in claim 14, wherein said heat sink is fixed to a main heat sink forming part of the mechanical structure of a casing of the electronic module receiving the card.

* * * * *